United States Patent
Singh et al.

(10) Patent No.: US 12,470,172 B2
(45) Date of Patent: Nov. 11, 2025

(54) OSCILLATORS HAVING COMPARATORS THEREIN WITH IMPROVED COMMON MODE VARIATION ACROSS A WIDE RANGE OF PROCESS-VOLTAGE-TEMPERATURE (PVT) CHANGES

(71) Applicant: SAMSUNG ELECTRONICS CO., LTD., Suwon-si (KR)

(72) Inventors: Shubham Raj Singh, Karnataka (IN); Ravindra Kumar Singh, Karnataka (IN); Subodh Prakash Taigor, Karnataka (IN)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/410,041

(22) Filed: Jan. 11, 2024

(65) Prior Publication Data
US 2024/0322755 A1  Sep. 26, 2024

(30) Foreign Application Priority Data

Mar. 24, 2023 (IN) ............................ 202341021304
Dec. 11, 2023 (IN) ............................ 202341021304

(51) Int. Cl.
*H03K 3/023* (2006.01)
*H03B 5/04* (2006.01)
*H03B 5/24* (2006.01)

(52) U.S. Cl.
CPC ............. *H03B 5/04* (2013.01); *H03B 5/24* (2013.01)

(58) Field of Classification Search
CPC .................................................. H03K 3/0231
(Continued)

(56) References Cited

U.S. PATENT DOCUMENTS 6,356,161 B1 * 3/2002 Nolan ................... H03K 3/011
331/74
9,680,453 B1 6/2017 Zanetta et al.
(Continued)

FOREIGN PATENT DOCUMENTS

| CN | 109525197 A | 3/2019 |
| CN | 113258903 A | 8/2021 |
| WO | 2021137693 A1 | 7/2021 |

OTHER PUBLICATIONS

Aita, ANDRé L., et al., "A 0.45V CMOS Relaxation Oscillator with ±2.5% Frequency Stability from -55°C to 125°C", 2015 IEEE International Symposium on Circuits and Systems (ISCAS), May 2015, pp. 493-496.
(Continued)

*Primary Examiner* — Joseph Chang
(74) *Attorney, Agent, or Firm* — Wolf, Greenfield & Sacks, P.C.

(57) ABSTRACT

An oscillator includes first and second comparators, a first impedance network having a first trim element therein, and a second impedance network having a second trim element therein. The first impedance network is electrically connected to a first input terminal of the first comparator, and the second impedance network is electrically connected to a first input terminal of the second comparator. The first and second impedance networks are configured to cause an improvement in common mode variation within the first and second comparators, in response to trimming of at least one of the first and second trim elements.

18 Claims, 4 Drawing Sheets

(58) Field of Classification Search
USPC .......................................................... 331/111
See application file for complete search history.

(56) References Cited

U.S. PATENT DOCUMENTS

| | | |
|---|---|---|
| 10,454,460 B2 | 10/2019 | Lim |
| 2007/0241833 A1 | 10/2007 | Nervegna |
| 2018/0219536 A1* | 8/2018 | Lee .................. H03K 3/013 |

OTHER PUBLICATIONS

Barnett, Ray, et al., "A 0.8V 1.52MHz MSVC Relaxation Oscillator with Inverted Mirror Feedback Reference for UHF RFID", IEEE 2006 Custom Intergrated Circuits Conference (CICC), Sep. 2006, pp. 769-772.

Zheng, Yongan, et al., "A 51-nW 32.7-kHz CMOS Relaxation Oscillator with Half-Period Pre-Charge Compensation Scheme for Ultra-Low Power Systems", 2016 IEEE International Symposium on Circuits and Systems (ISCAS) (May 2016), May 2016, pp. 830-833.

Extended European Search Report corresponding to European Application No. 24164795.7 (11 pages) (Aug. 7, 2024).

* cited by examiner

OSCILLATORS HAVING COMPARATORS THEREIN WITH IMPROVED COMMON MODE VARIATION ACROSS A WIDE RANGE OF PROCESS-VOLTAGE-TEMPERATURE (PVT) CHANGES

CROSS-REFERENCE TO RELATED APPLICATIONS

The present application claims priority to and the benefit under 35 U.S.C. § 119 to Indian Non-Provisional Patent Application No. 202341021304, filed Dec. 11, 2023, at the Patent Office of India, and to Indian Provisional Patent Application No. 202341021304, filed Mar. 24,2023, at the Patent Office of India, the entire disclosures of which are incorporated herein by reference.

TECHNICAL FIELD

The present disclosure relates to integrated circuit devices and, more particularly, to integrated circuit oscillators.

BACKGROUND

An oscillator, which can generate a signal having a stable frequency, may include components, such as comparators or Schmitt triggers, to maintain their oscillation. One important performance factor concerning oscillators is frequency stability, which can be dependent on variations in process, voltage, and temperature (PVT).

As shown by FIG. 1, a conventional oscillator 100 may include: (i) a voltage/current reference generator 102 for generating a reference voltage $V_{REF}$ and a reference current IREF, (ii) a push-pull signal generator 104, which is responsive to a pair of oscillator output signals Q, QB (provided as feedback signals), (iii) a first comparator 106a having a first input terminal (−) responsive to the reference voltage $V_{REF}$, and a second input terminal (+), which is responsive to a first current signal generated at a first output node $OUT_1$ of the push-pull signal generator 104 and is electrically connected to a first terminal of a first capacitor C1, (iv) a second comparator 106b having a first input terminal (−) responsive to the reference voltage $V_{REF}$, and a second input terminal (+), which is responsive to a second current signal generated at a second output node $OUT_2$ of the push-pull signal generator 104 and is electrically connected to a first terminal of a second capacitor C2, and (v) a set-reset (SR) latch 108, which generates the pair of oscillator output signals Q, QB based on the relative timing of a SET signal generated at an output of the first comparator 106a and a RESET signal generated at an output of the second comparator 106b.

As will be understood by those skilled in the art, if the oscillator output signals Q, QB are set to Q=1 and QB=0, the first capacitor C1 will be discharged and the second capacitor C2 will be charged by the push-pull signal generator 104. In response, the SET signal will switch to SET=0 at the output of the first comparator 106a, and the RESET signal will switch to RESET=1 at the output of the second comparator 106b. Then, in response to the switching of SET and RESET, the oscillator output signals Q, QB will be set to Q=0 and QB=1 in a next switching cycle, which will commence charging of the first capacitor C1 and discharging of the second capacitor C2.

Here, the capacitance values of the first and second capacitors C1, C2 will control a frequency of the oscillator output signals Q, QB (in an inverse relationship), which will have a common mode offset voltage set by a value of the reference voltage $V_{REF}$. As shown by the configuration of the voltage/current reference generator 102, the magnitude of the reference voltage $V_{REF}$ is a function of a value of a reference resistor $R_{REF}$, and the currents provided by the matched current sources $I_{REF1}$, $I_{REF2}$. Moreover, if a high degree of frequency stability over a wide PVT is required, then a resistance provided by the reference resistor $R_{REF}$ may need to be trimmed. Unfortunately, conventional techniques to trim the reference resistor $R_{REF}$ may not be adequate to sufficiently reduce variations in the common mode voltage across a wide PVT.

Additional oscillators may be configured as relaxation oscillators having single-ended and differential structures, which enable low voltage and low power operation, as disclosed in articles by: R. Barnett et al., entitled "A 0.8V 1.52 MHZ MSVC Relaxation Oscillator with Inverted Mirror Feedback Reference for UHF RFID," Proc. *IEEE Custom Integrated Circuits Conf.*, 2006, pp. 769-772, and A. L. Aita et al., entitled "A 0.45V CMOS Relaxation Oscillator with +2.5% Frequency Stability from −55° C. to 125° C.," *Proc. IEEE Int. Symp. Circuits and Systems*, 2015, pp. 493-496. Unfortunately, as disclosed in an article by Y. Zheng et al., entitled "A 51-nW 32.7-KHz CMOS Relaxation Oscillator with Half-Period Pre-Charge Compensation Scheme for Ultra-Low Power Systems," *IEEE Int. Symp. Circuits and Systems*, May 2016, pp. 830-833, these types of relaxation oscillators may suffer from relatively large frequency variations as a function of temperature and supply voltage, which may be caused by the non-idealities of comparators and clock buffers therein. To address these limitations, the article by Y. Zheng et al. discloses a relaxation oscillator having a half-period pre-charge compensation scheme in which comparator non-idealities are compensated for, and temperature and supply voltage variation tolerance of oscillation frequency are improved, by adding two charging switches, two 2-to-1 multiplexers and a control logic generation circuit, as shown by FIGS. 2-3 therein.

SUMMARY

An oscillator according to some embodiments of the invention includes: (i) first and second comparators (e.g., operational amplifiers), (ii) a first impedance network having a first trim element therein, electrically connected to a first input terminal of the first comparator, and (iii) a second impedance network having a second trim element therein, electrically connected to a first input terminal of the second comparator. Advantageously, the first and second impedance networks are configured to cause an improvement in common mode variation within the first and second comparators, in response to trimming of at least one of the first and second trim elements, which may be first and second trim resistors, respectively. In particular, the first impedance network may include a first capacitor in parallel with a first trim resistor, and the second impedance network may include a second capacitor in parallel with a second trim resistor.

According to further embodiments, a second input terminal of the first comparator and a second input terminal of the second comparator may both be responsive to a reference voltage. In addition, the first and second comparators may be responsive to first and second bias signals, which are generated by a current mirror circuit. A push-pull signal generator may also be provided, which has a first output electrically coupled to the first input terminal of the first comparator and a second output electrically coupled to the first input terminal of the second comparator. The current mirror circuit may provide the push-pull signal generator with a bias current. A latch may also be provided, which has first and second input terminals electrically coupled to an output terminal of the first comparator and an output terminal of the second comparator, respectively. The latch may be a set-reset (SR) latch, which is configured to generate true and complementary output signals in response to a first periodic signal generated at the output terminal of the first comparator and a second periodic signal generated at the output terminal of the second comparator. The push-push switch network may also be responsive to the true and complementary output signals generated by the latch. The current mirror circuit may also be configured to generate the reference voltage.

According to further embodiments of the invention, an oscillator is provided, which includes: (i) first and second comparators, (ii) a first impedance network having a first trim element therein, electrically connected to a first input terminal of the first comparator, (iii) a second impedance network having a second trim element therein, electrically connected to a first input terminal of the second comparator, (iv) a push-pull signal generator having a first output electrically coupled to the first input terminal of the first comparator and a second output electrically coupled to the first input terminal of the second comparator, and (v) a constant current generating circuit configured to provide the first comparator with a first bias current, the second comparator with a second bias current, and the push-pull signal generator with a third bias current. Advantageously, the first and second impedance networks are configured to cause an improvement in common mode variation within the first and second comparators, in response to trimming of at least one of the first and second trim elements. In some embodiments, the first impedance network may include a first capacitor in parallel with a first trim resistor, and the second impedance network may include a second capacitor in parallel with a second trim resistor. The constant current generating circuit may also be configured to generate a reference voltage, which is provided to a second input terminal of the first comparator and a second input terminal of the second comparator.

According to additional embodiments of the invention, an oscillator is provided, which includes: (i) first and second comparators, (ii) a first impedance network having a first trim element therein, electrically connected to a first input terminal of the first comparator, (iii) a second impedance network having a second trim element therein, electrically connected to a first input terminal of the second comparator, and (iv) a constant current generating circuit configured to provide the first comparator with a first bias current, the second comparator with a second bias current, and the second input terminals of the first and second comparators with a reference voltage. In some of these embodiments, the first impedance network includes a first capacitor in parallel with a first trim resistor, and the second impedance network includes a second capacitor in parallel with a second trim resistor. A latch may also be provided, which is configured to generate true and complementary output signals in response to a first periodic signal generated at the output terminal of the first comparator and a second periodic signal generated at the output terminal of the second comparator. A push-pull signal generator may be provided, which is responsive to the true and complementary output signals. This push-pull signal generator may have a first output electrically coupled to the first input terminal of the first comparator and a second output electrically coupled to the first input terminal of the second comparator.

BRIEF DESCRIPTION OF FIGURES

Embodiments will be more clearly understood from the following detailed description taken in conjunction with the accompanying drawings in which.

DETAILED DESCRIPTION

Figure 1:
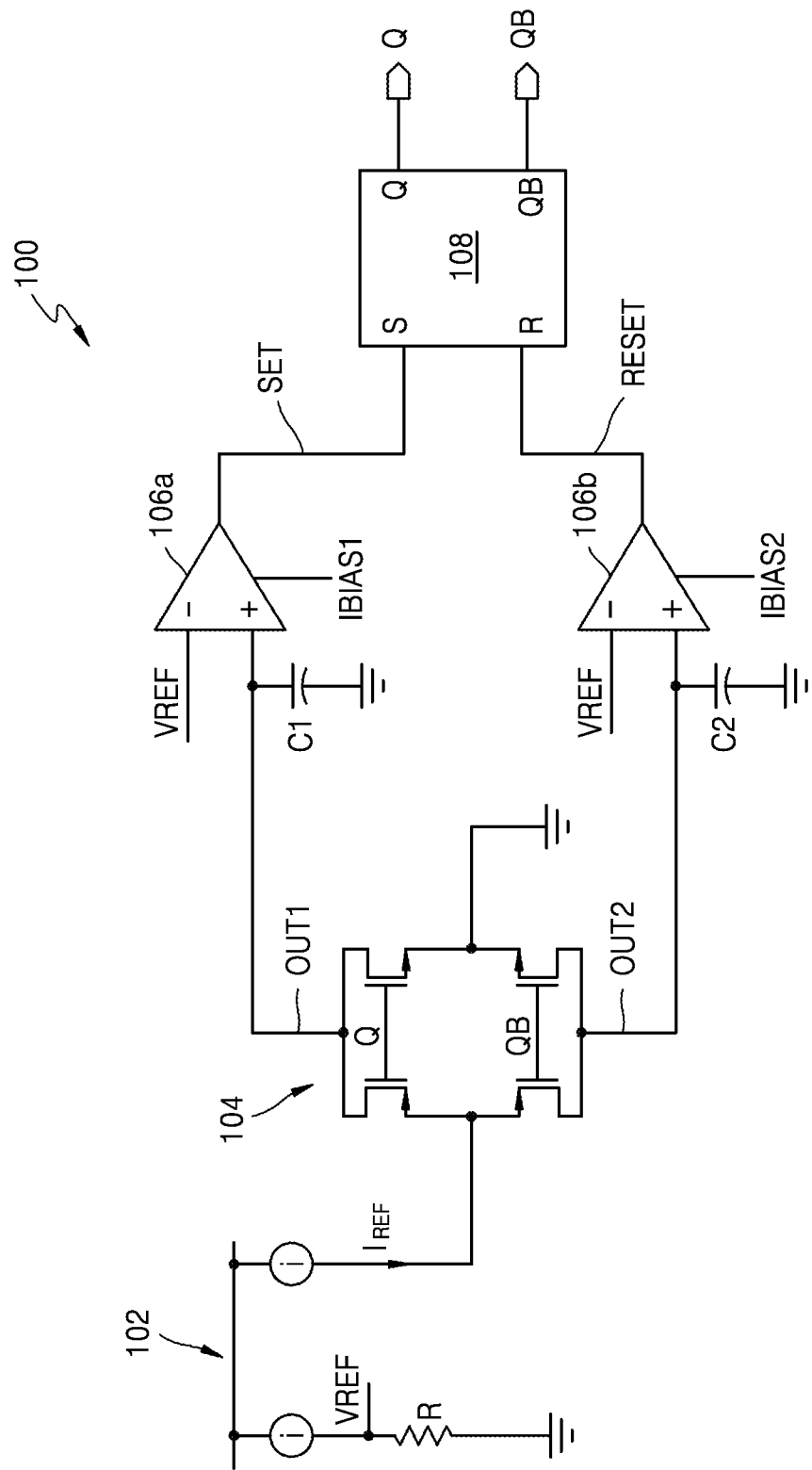
FIG. 1 illustrates a conventional oscillator having paired comparators therein.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2A:
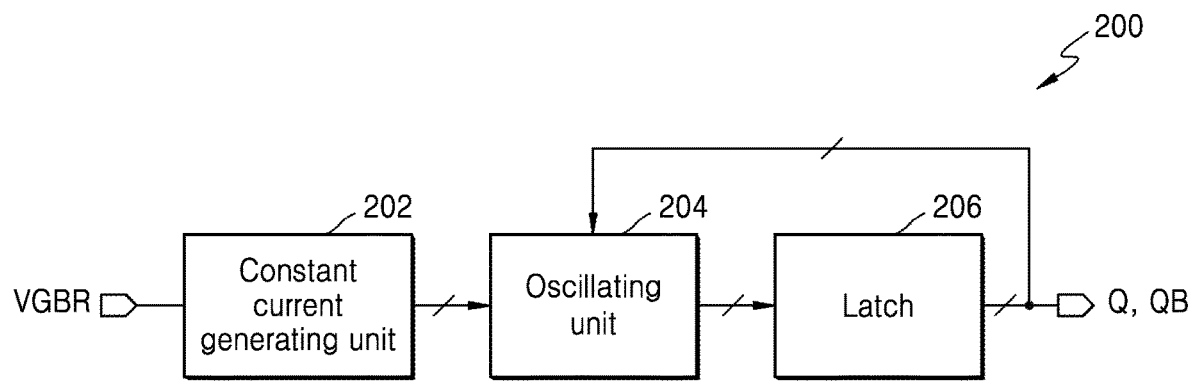
FIG. 2A illustrates a block diagram of an oscillator according to an embodiment of the invention, as disclosed herein.

Referring now to FIG. 2A, an oscillator 200 according to an embodiment of the invention is illustrated as including a multi-block arrangement of a constant current generating circuit 202, an oscillating circuit 204, and a latch 206, which generates a periodic output signal(s) and also utilizes the periodic output signal(s) as self-regulating feedback that supports stable and reliable oscillation within the oscillating circuit 204. As described more fully hereinbelow, the periodic output signal(s) may be a pair of true and complementary output signals Q, QB, which have equivalent duty cycles and differ in phase by 180°.

Figure 2B:
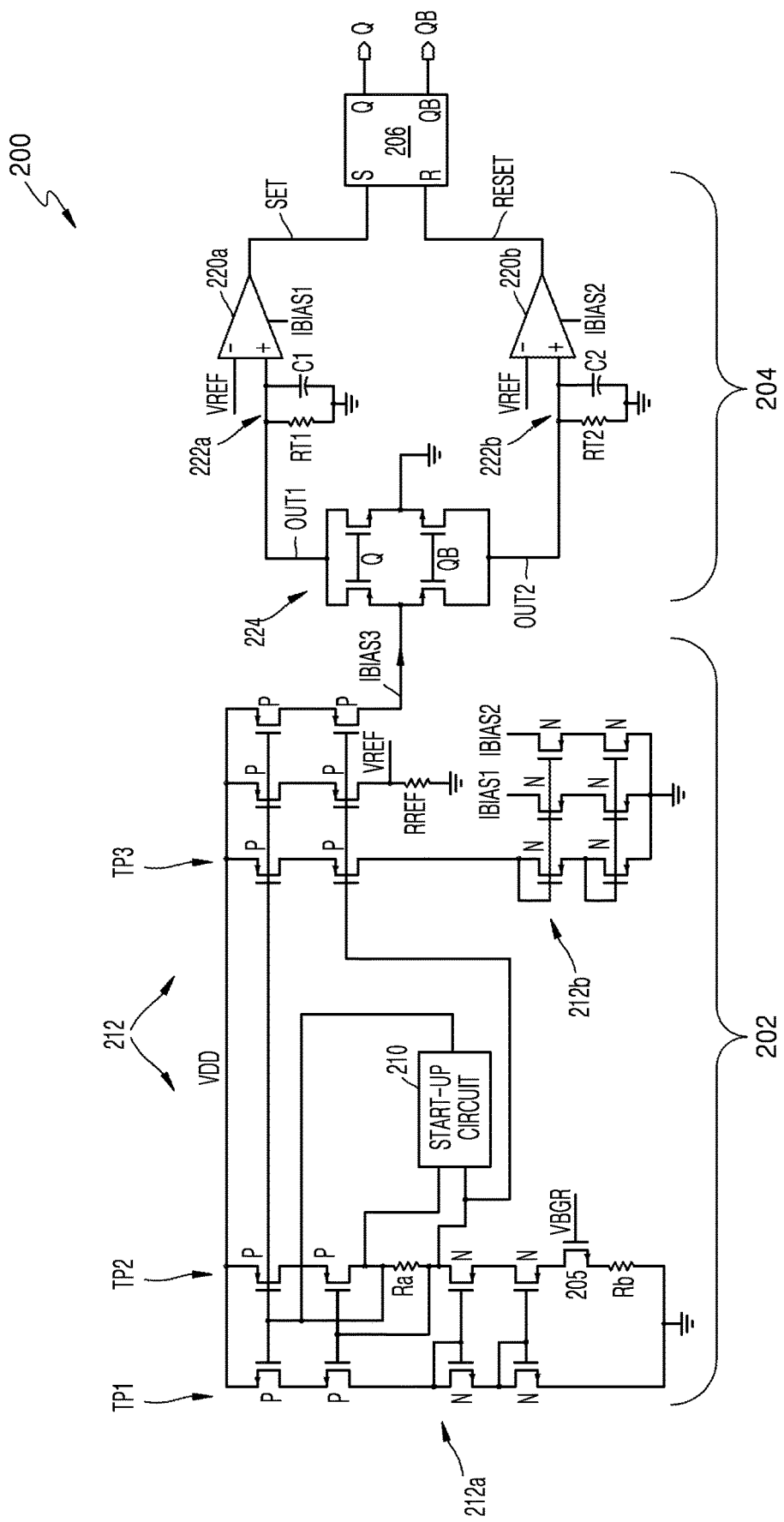
FIG. 2B is a detailed electrical schematic of an oscillator according to an embodiment of the invention, as disclosed herein.

Referring now to FIG. 2B, which is a detailed electrical schematic of an embodiment of the oscillator 200 of FIG. 2A, the constant current generating circuit 202 may be configured to include: (i) a start-up circuit 210, which supports maintenance of a constant current flow within the oscillator 200, and (ii) a current mirror network 212, which combines a master current mirror circuit 212a with a slave current mirror circuit 212b to thereby generate a plurality of bias current signals and a stable reference voltage. As shown, the master current mirror circuit 212a includes first and second totem-pole arrangements of PMOS and NMOS transistors, which are powered by rail-to-rail power supply signals (VDD and GND). The first totem pole arrangement (TP1) is shown as including two PMOS transistors P and two NMOS transistors N electrically connected in series between VDD and GND. Similarly, the second totem pole arrangement (TP2) is shown as including a series combination of two PMOS transistors P and two NMOS transistors N, a pair of resistors Ra, Rb, and an NMOS transistor 205 having a gate terminal responsive to a bandgap reference voltage (VBGR). As will be understood by those skilled in the art, this bandgap reference voltage VBGR may be controlled to a desired value that sets a series "drain-to-source" resistance of the NMOS transistor 205 and indirectly controls (with an additional resistance contribution from Rb) the magnitudes of the mirrored currents within TP1 and TP2.

The slave current mirror circuit 212b includes a third totem-pole arrangement (TP3) of two PMOS transistors P and two NMOS transistors N, which indirectly control first, second and third bias current signals IBIAS1, IBIAS2, IBIAS3 and a reference voltage VREF. In particular, the serially-connected pair of PMOS transistors P within TP3, which receive corresponding gate voltages from the master current mirror circuit 212a, are electrically coupled to: (i) a serially-connected pair of PMOS transistors P, which provide a mirrored bias current to a reference resistor RREF that results in the generation of VREF at a node of RREF, and (ii) a serially-connected pair of PMOS transistors P that source the third bias current IBIAS3, as shown. In addition, the serially-connected pair of NMOS transistors N within TP3 are electrically coupled to two pairs of serially-connected NMOS transistors N, which regulate the first and second bias currents IBIAS1, IBIAS2 as sink currents (to corresponding comparators). As will be understood by those skilled in the art, these bias currents may have magnitudes proportional to $\Delta VGS/R$, where VGS corresponds to the gate-to-source voltage of NMOS transistor 205 and R is equivalent to a sum of the resistance of Rb and the drain-to-source resistance of NMOS transistor 205.

The oscillating circuit 204 of FIG. 2B is illustrated as including: (i) first and second comparators 220a, 220b, (ii) a first impedance network 222a having a first trim element therein, which is electrically connected to a "+" input terminal of the first comparator 220a, (iii) a second impedance network 222b having a second trim element therein, which is electrically connected to a "+" input terminal of the second comparator 220b, and (iv) a push-pull signal generator 224 having a first output (OUT1) electrically coupled to the "+" input terminal of the first comparator 220a and a second output (OUT2) electrically coupled to the "+" input terminal of the second comparator 220b. As shown, the push-pull signal generator 224, which includes four MOS transistors, is responsive to the third bias current IBIAS3 and the pair of true and complementary output signals Q, QB, which are generated by the latch 206 and provided as feedback within a control loop.

In addition, the first and second impedance networks 222a, 222b may each include one or more resistive elements and one or more reactive elements, and the "−" terminals of the first and second comparators 220a, 220b may receive the reference voltage VREF generated by the slave current mirror circuit 212b. Although not wishing to be bound by any specific configuration, each of the first and second impedance networks 222a, 222b may be configured as a parallel RC network consisting of a trimmable "trim" resistor (e.g., RT1, RT2), as a trim element, and a corresponding capacitor (C1, C2), as shown.

These capacitors C1 and C2 (e.g., metal-insulator-metal (MIM) capacitors) are repeatedly charged and discharged based on an alternating, and 180° out-of-phase, sequence of charging and discharging currents provided at the first and second outputs OUT1, OUT2 of the push-pull signal generator 224. Thus, each time the first capacitor C1 is charged to a voltage in excess of VREF, the output terminal of the first comparator 220a (i.e., SET) switches low-to-high, and each time the first capacitor C1 is discharged to a voltage below VREF, the output terminal of the first comparator 220a switches high-to-low. Likewise, each time the second capacitor C2 is charged to a voltage in excess of VREF, the output terminal of the second comparator 220b (i.e., RESET) switches low-to-high, and each time the second capacitor C2 is discharged to a voltage below VREF, the output terminal of the second comparator 220b switches high-to-low. Based on these switching operations, the periodic SET and RESET signals will have equivalent frequencies and duty cycles, but will cycle 180° out-of-phase relative to each other.

Advantageously, the first and second impedance networks 222a, 222b are configured to cause an improvement in common mode variation within the first and second comparators 220a, 220b, in response to trimming of at least one of the first and second trim elements. Moreover, this improvement in common mode variation can cause the periodic signals (i.e., SET, RESET) generated by the first and second comparators 220a, 220b to have improved timing characteristics, such that the latch 206, which has set (S) and reset (R) input terminals responsive to the periodic signals, can generate true and complementary output signals Q, QB having improved frequency stability over variations in process (P), voltage (V) and temperature (T).

Figure 3:
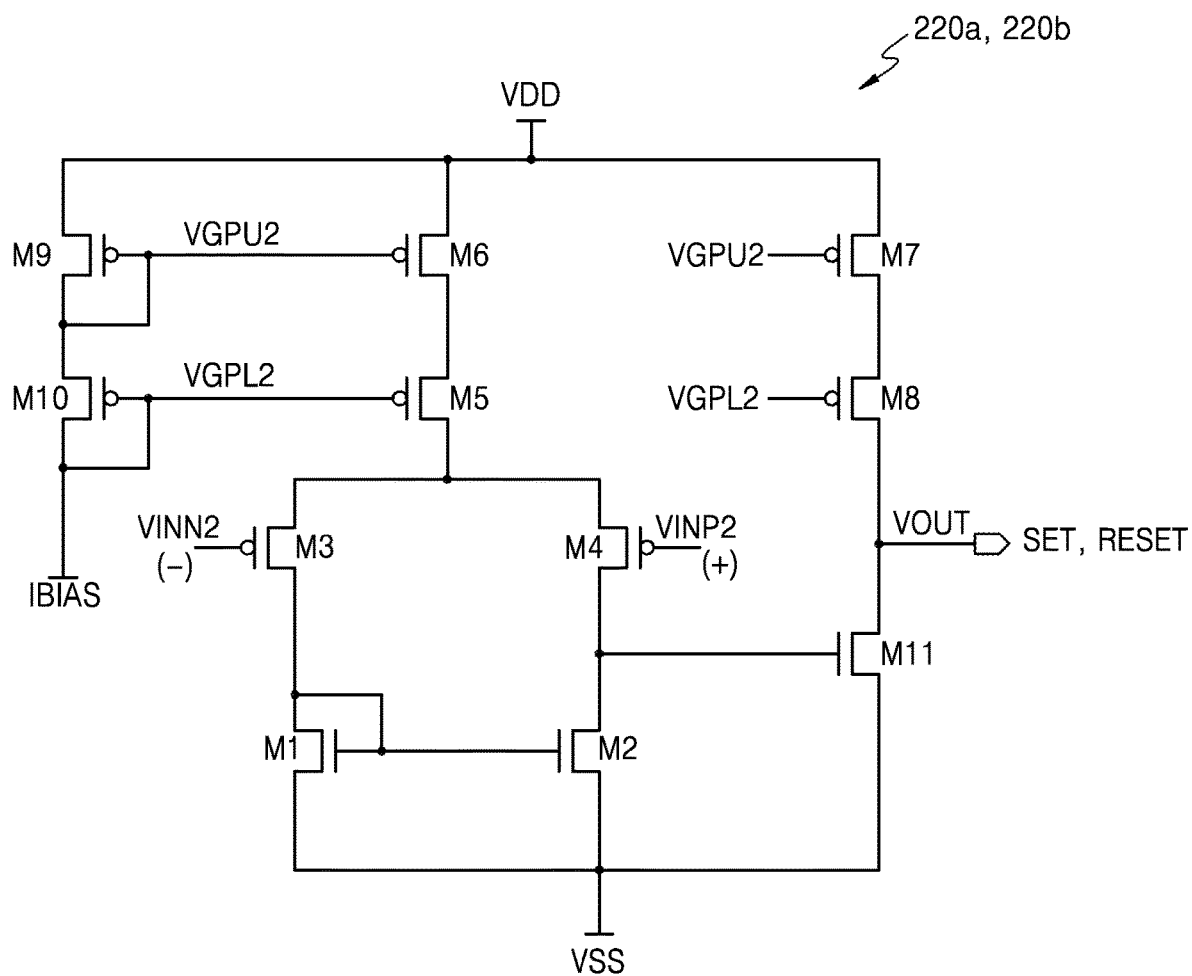
FIG. 3 is a detailed electrical schematic of a comparator, which may be used in the oscillator of FIG. 2B.

Referring now to FIG. 3, a detailed electrical schematic of an embodiment of the first and second comparators 220a, 220b, which may be utilized within the oscillator 200 of FIGS. 2A-2B, is shown as including a primary amplifier stage defined by six MOS transistors: (i) NMOS transistors M1, M2, (ii) PMOS transistors M3, M4, which have gate terminals corresponding to the "−" comparator input terminal (as VINN2) and the "+" comparator input terminal (as VINP2), and (iii) serially-connected PMOS transistors M5, M6. In addition, a current mirroring stage is provided by a totem-pole arrangement of two PMOS transistors M9, M10, which have gate terminals connected to the gate terminals of PMOS transistors M6, M5 within the first amplifier stage, and have drain-to-source current paths that support a corresponding bias signal IBIAS (see, e.g., IBIAS1, IBIAS2 in FIG. 2B). Finally, a comparator output stage is provided by a pair of PMOS transistors M7, M8, which have gate terminals connected to nodes VGPU2, VGPL2 of the current mirror stage, as shown, and an NMOS pull-down transistor M11 having gate terminal connected to a node within the primary amplifier stage and a drain terminal connected to an output node VOUT (e.g., SET, RESET) of the comparator, as shown. As will be understood by those skilled in the art, the switching speed at output node VOUT is controlled by the mirrored series current within the PMOS transistors M7, M8, which is dependent on a magnitude of the bias current IBIAS within PMOS transistors M9, M10.

While the inventive concept has been particularly shown and described with reference to embodiments thereof, it will be understood that various changes in form and details may be made therein without departing from the spirit and scope of the following claims.

What is claimed is:

1. An oscillator, comprising:
   first and second comparators;
   a first impedance network having a first trim element therein, electrically connected to a first input terminal of the first comparator; and
   a second impedance network having a second trim element therein, electrically connected to a first input terminal of the second comparator,
   wherein the first impedance network having the first trim element comprises a first capacitor in parallel with a first trim resistor, and the second impedance network having the second trim element comprises a second capacitor in parallel with a second trim resistor.

2. The oscillator of claim 1, wherein the first and second impedance networks are configured to cause an improvement in common mode variation within the first and second comparators, in response to trimming of at least one of the first and second trim elements.

3. The oscillator of claim 1, wherein a second input terminal of the first comparator and a second input terminal of the second comparator are both responsive to a reference voltage.

4. The oscillator of claim 3, wherein the first and second comparators are responsive to first and second bias signals, which are generated by a current mirror circuit.

5. The oscillator of claim 4, further comprising a push-pull signal generator having a first output electrically coupled to the first input terminal of the first comparator and a second output electrically coupled to the first input terminal of the second comparator.

6. The oscillator of claim 5, wherein the current mirror circuit provides the push-pull signal generator with a bias current.

7. The oscillator of claim 5, further comprising a latch having first and second input terminals electrically coupled to an output terminal of the first comparator and an output terminal of the second comparator, respectively.

8. The oscillator of claim 7, wherein the latch is a set-reset (SR) latch, which is configured to generate true and complementary output signals in response to a first periodic signal generated at the output terminal of the first comparator and a second periodic signal generated at the output terminal of the second comparator.

9. The oscillator of claim 8, wherein the push-pull signal generator is responsive to the true and complementary output signals generated by the latch.

10. The oscillator of claim 4, wherein the current mirror circuit is configured to generate the reference voltage.

11. An oscillator, comprising:
    first and second comparators;
    a first impedance network having a first trim element therein, electrically connected to a first input terminal of the first comparator;
    a second impedance network having a second trim element therein, electrically connected to a first input terminal of the second comparator;
    a push-pull signal generator having a first output electrically coupled to the first input terminal of the first comparator and a second output electrically coupled to the first input terminal of the second comparator; and
    a constant current generating circuit configured to provide the first comparator with a first bias current, the second comparator with a second bias current, and the push-pull signal generator with a third bias current.

12. The oscillator of claim 11, wherein the first and second impedance networks are configured to cause an improvement in common mode variation within the first and second comparators, in response to trimming of at least one of the first and second trim elements.

13. The oscillator of claim 12, wherein the first impedance network comprises a first capacitor in parallel with a first trim resistor, and the second impedance network comprises a second capacitor in parallel with a second trim resistor.

14. The oscillator of claim 11, wherein the constant current generating circuit is further configured to generate a reference voltage, which is provided to a second input terminal of the first comparator and a second input terminal of the second comparator.

15. An oscillator, comprising:
    first and second comparators;
    a first impedance network having a first trim element therein, electrically connected to a first input terminal of the first comparator;
    a second impedance network having a second trim element therein, electrically connected to a first input terminal of the second comparator; and
    a constant current generating circuit configured to provide the first comparator with a first bias current, the second comparator with a second bias current, and second input terminals of the first and second comparators with a reference voltage.

16. The oscillator of claim 15, wherein the first impedance network comprises a first capacitor in parallel with a first trim resistor, and the second impedance network comprises a second capacitor in parallel with a second trim resistor.

17. The oscillator of claim 16, further comprising a latch, which is configured to generate true and complementary output signals in response to a first periodic signal generated at an output terminal of the first comparator and a second periodic signal generated at an output terminal of the second comparator.

18. The oscillator of claim 17, further comprising a push-pull signal generator responsive to the true and complementary output signals, said push-pull signal generator having a first output electrically coupled to the first input terminal of the first comparator and a second output electrically coupled to the first input terminal of the second comparator.

* * * * *